(12) United States Patent
Kikuchi

(10) Patent No.: US 12,298,348 B2
(45) Date of Patent: May 13, 2025

(54) RELAY WELDING DIAGNOSING APPARATUS

(71) Applicant: Isuzu Motors Limited, Yokohama (JP)

(72) Inventor: Takuya Kikuchi, Fujisawa (JP)

(73) Assignee: Isuzu Motors Limited, Yokohama (JP)

( * ) Notice: Subject to any disclaimer, the term of this patent is extended or adjusted under 35 U.S.C. 154(b) by 124 days.

(21) Appl. No.: 18/124,605

(22) Filed: Mar. 22, 2023

(65) Prior Publication Data

US 2023/0305060 A1    Sep. 28, 2023

(30) Foreign Application Priority Data

Mar. 24, 2022   (JP) .................. 2022-048956

(51) Int. Cl.
  *G01R 31/327*   (2006.01)
  *B60L 3/00*   (2019.01)
(52) U.S. Cl.
  CPC ........ *G01R 31/3278* (2013.01); *B60L 3/0046* (2013.01)
(58) Field of Classification Search
  CPC ..... G01R 31/3278; G01R 31/006; B60L 3/04; B60L 3/0046
  See application file for complete search history.

(56) References Cited

U.S. PATENT DOCUMENTS

| 2006/0021098 | A1 | 1/2006 | Tezuka |
| 2020/0139832 | A1* | 5/2020 | Kojima ................ H01H 47/002 |
| 2020/0328478 | A1* | 10/2020 | Nozawa ................ B60L 3/0046 |
| 2023/0387713 | A1* | 11/2023 | Otsuka ..................... B60K 6/26 |

FOREIGN PATENT DOCUMENTS

| JP | 2021-081392 | 5/2021 |
| WO | WO 2004/088696 | 10/2004 |

\* cited by examiner

*Primary Examiner* — Neel D Shah
*Assistant Examiner* — Adam S Clarke

(57) ABSTRACT

A relay welding diagnosing apparatus can lower a risk of erroneous diagnosis while preventing energy of a battery from being discharged uselessly. The relay welding diagnosing apparatus including a positive electrode side relay, a negative electrode side relay, and a capacitor and a load circuit that are connected in parallel between the positive electrode side relay and the negative electrode side relay, which is forced discharge, by connecting the capacitor and the load circuit; and a determining section that, in a case where the negative electrode side relay is not welded, determines whether or not the positive electrode side relay is welded after the active discharge is performed and, in a case where the negative electrode side relay is welded, determines whether or not the positive electrode side relay is welded after passive discharge of the capacitor, which is natural discharge, is performed.

2 Claims, 2 Drawing Sheets

RELAY WELDING DIAGNOSING APPARATUS

RELATED APPLICATIONS

This application claims the benefit of priority of Japan Patent Application No. 2022-048956 filed on Mar. 24, 2022, the contents of which are incorporated by reference as if fully set forth herein in their entirety.

TECHNICAL FIELD

The present disclosure relates to a relay welding diagnosing apparatus.

BACKGROUND ART

An electric hybrid vehicle, an electric vehicle, or the like is configured such that a motor is driven by electric power from a direct-current power source such as a secondary battery.

For example, Patent Literature 1 discloses a method for detecting welding of a relay contact in a circuit having a direct-current power source, a load circuit, a capacitor provided in parallel with the load circuit, first and second main relays inserted into a pair of power source lines between the direct-current power source and the load circuit, respectively, and a pre-charge relay provided in parallel with a contact of the first main relay.

CITATION LIST

Patent Literature

PTL 1
WO 2004/088696

SUMMARY OF INVENTION

Technical Problem

In a case where welding diagnosis for determining whether or not a relay contact is welded is performed, a capacitor connected in a circuit needs to be discharged in advance. The capacitor is discharged not by passive discharge of the capacitor, which is natural discharge, but by active discharge. A reason why the capacitor is discharged by active discharge is that a period required for active discharge is shorter than a period required for passive discharge and therefore a period required for welding diagnosis using active discharge is shorter than a period required for welding diagnosis using passive discharge.

However, for example, in a case where a relay contact is welded, active discharge may undesirably cause energy of a battery to be discharged uselessly. Furthermore, in a case where passive discharge is performed instead of active discharge, a period required for welding diagnosis becomes longer. This undesirably increases a risk of erroneously diagnosing whether or not a relay contact is welded.

An object of the present disclosure is to provide a relay welding diagnosing apparatus that can lower a risk of erroneous diagnosis while preventing energy of a battery from being discharged uselessly.

Solution to Problem

In order to achieve the above mentioned object, a relay welding diagnosing apparatus in the present disclosure is an apparatus in a power source system including a positive electrode side relay whose one terminal is connected to a positive electrode side of a battery, a negative electrode side relay whose one terminal is connected to a negative electrode side of the battery, and a capacitor and a load circuit that are connected in parallel between another terminal of the positive electrode side relay and another terminal of the negative electrode side relay, the apparatus including:
a control section that executes control for performing active discharge of the capacitor, which is forced discharge, by connecting the capacitor and the load circuit; and
a determining section that, in a case where the negative electrode side relay is not welded, determines whether or not the positive electrode side relay is welded after the active discharge is performed and, in a case where the negative electrode side relay is welded, determines whether or not the positive electrode side relay is welded after passive discharge of the capacitor, which is natural discharge, is performed.

Advantageous Effects of Invention

According to the present disclosure, a risk of erroneous diagnosis can be lowered while preventing energy of a battery from being discharged uselessly.

DESCRIPTION OF EMBODIMENTS

Figure 1:
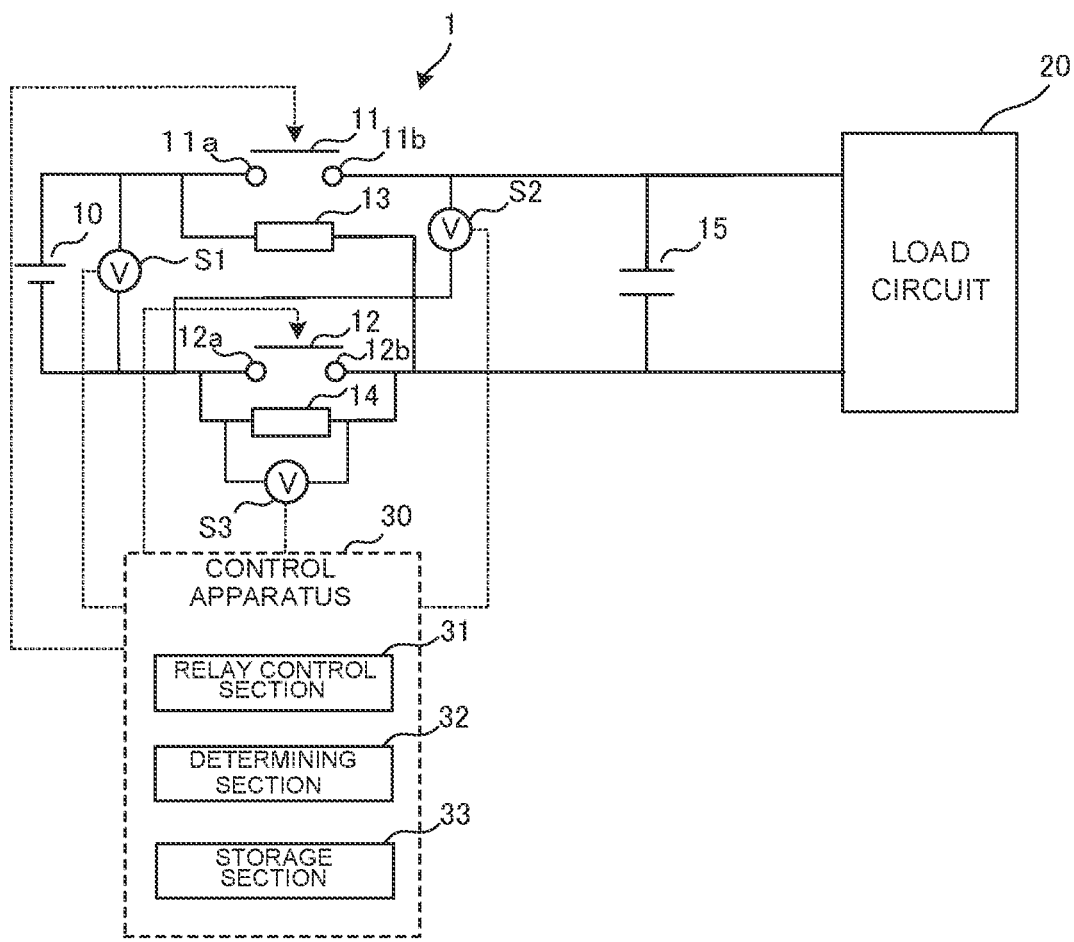
FIG. 1 illustrates a power source system including a relay according to an embodiment of the present disclosure.

An embodiment of the present disclosure is described below with reference to the drawings. FIG. 1 illustrates power source system 1 according to the embodiment of the present disclosure, and power source system 1 is mounted in a vehicle such as an electric vehicle or a hybrid vehicle.

Power source system 1 includes battery 10, positive electrode side relay 11, negative electrode side relay 12, resistors 13 and 14, capacitor 15, load circuit 20, and control apparatus 30 (corresponding to a "relay diagnosing apparatus" of the disclosure).

Battery 10 supplies electric power to load circuit 20 through an electric path. Note that active discharge of capacitor 15, which is forced discharge, and passive discharge of capacitor 15, which is natural discharge, are performed in an assembled battery including a plurality of batteries 10.

Positive electrode side relay 11 is provided between battery 10 and load circuit 20. Positive electrode side relay 11 has contacts 11a and 11b. Contact 11a is connected to a positive electrode side terminal of battery 10. Contact 11b is connected to load circuit 20. In the following description, a state where movable contacts of positive electrode side relay 11 are in contact with fixed contacts (contacts 11a and 11b) is referred to as a "closed state", and a state where the movable contacts are not in contact with the fixed contacts is referred to as an "open state".

Negative electrode side relay 12 is provided between battery 10 and load circuit 20. Negative electrode side relay 12 has contacts 12a and 12b. Contact 12a is connected to a negative electrode terminal of battery 10. Contact 12b is connected to load circuit 20. In the following description, a state where movable contacts of negative electrode side relay 12 are in contact with fixed contacts (contacts 12a and 12b) is referred to as a "closed state", and a state where the movable contacts are not in contact with the fixed contacts is referred to as an "open state".

Load circuit 20 receives electric power from battery 10 through positive electrode side relay 11 and negative electrode side relay 12.

Capacitor 15 is connected in parallel with load circuit 20. Capacitor 15 constitutes a "capacitor circuit" of the present disclosure.

Resistor 13 is connected between contact 11a and contact 12b.

Resistor 14 is connected between contact 12a and contact 12b.

Voltage measuring section S1 measures a voltage between the positive electrode terminal and the negative electrode terminal of battery 10.

Voltage measuring section S2 measures a voltage between contact 11b and contact 12a.

Voltage measuring section S3 measures a voltage between contact 12a and contact 12b.

Control apparatus 30 includes a central processing unit (CPU), a read only memory (ROM), and a random access memory (RAM). The CPU reads out a program corresponding to processing contents from the ROM, loads the program into the RAM, and executes a predetermined function of control apparatus 30 in cooperation with the loaded program. This is performed while referring to various kinds of data stored in storage section 33. Storage section 33 is, for example, a non-volatile semiconductor memory (flash memory) or a hard disk drive. Battery ECU 30 may be incorporated into a vehicle electronic control unit (ECU) that controls each section of a vehicle, may be integral with another control ECU, or may be provided separately from a vehicle ECU or another control ECU, for example.

Control apparatus 30 executes control of performing forced discharge (active discharge) of capacitor 15 by connecting capacitor 15 and load circuit 20, and control apparatus 30 executes control of performing natural discharge (passive discharge) of capacitor 15 without connecting capacitor 15 and load circuit 20.

Control apparatus 30 has relay control section 31 and determining section 32 as predetermined functions. Relay control section 31 controls the states (the closed state and the open state) of positive electrode side relay 11 and negative electrode side relay 12.

Determining section 32 determines whether or not positive electrode side relay 11 is welded. This is performed after each of positive electrode side relay 11 and negative electrode side relay 12 is controlled to the open state. Specifically, in a case where a voltage difference between measurement value V1, which is a measurement result of voltage measuring section S1, and measurement value V2, which is a measurement result of voltage measuring section S2, is equal to or larger than a predetermined threshold value, determining section 32 determines that positive electrode side relay 11 is not welded. On the other hand, in a case where the voltage difference between measurement value V1 and measurement value V2 is less than the predetermined threshold value, determining section 32 determines that positive electrode side relay 11 is welded.

Determining section 32 determines whether or not negative electrode side relay 12 is welded. This is performed after each of positive electrode side relay 11 and negative electrode side relay 12 is controlled to the open state. Specifically, in a case where measurement value V3, which is a measurement result of voltage measuring section S3, is equal to or larger than a predetermined value, determining section 32 determines that negative electrode side relay 12 is not welded. In a case where measurement value V3 is less than the predetermined value, determining section 32 determines that negative electrode side relay 12 is welded.

In a case where it is determined whether or not positive electrode side relay 11 is welded, capacitor 15 needs to be discharged. Capacitor 15 is discharged by active discharge. However, capacitor 15 is discharged by active discharge. However, in a case where negative electrode side relay 12 is welded, energy of battery 10 may be undesirably discharged uselessly by the active discharge.

In view of this, in the present embodiment, determining section 32 first determines whether or not negative electrode side relay 12 is welded. In a case where negative electrode side relay 12 is not welded, control apparatus 30 executes control of performing active discharge by connecting capacitor 15 and load circuit 20. This starts discharge of an electric charge stored in capacitor 15 and passes an electric current through load circuit 20 (forced discharge of capacitor 15). In a case where negative electrode side relay 12 is welded, control apparatus 30 executes control of performing passive discharge without connecting capacitor 15 and load circuit 20. That is, natural discharge of capacitor 15 is performed.

Capacitor 15 is thus discharged. After capacitor 15 is discharged, determining section 32 determines whether or not positive electrode side relay 11 is welded.

Figure 2:
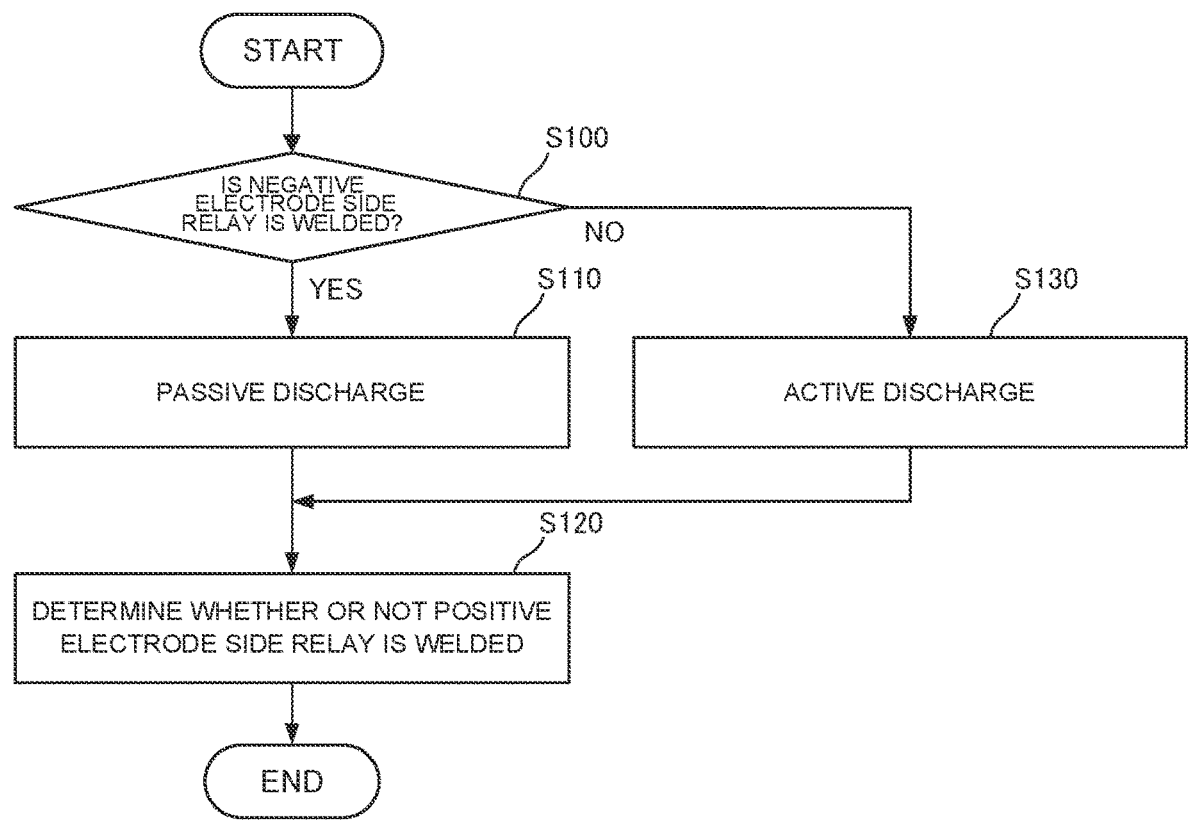
FIG. 2 is a flowchart illustrating an example of a relay welding diagnosing method according to the embodiment of the present disclosure.

Next, a relay welding diagnosing method according to the embodiment of the present disclosure is described with reference to FIG. 2. FIG. 2 is a flowchart illustrating an example of the relay welding diagnosing method according to the embodiment of the present disclosure. This flow is, for example, started after a key operation (or a vehicle terminating operation). Although steps in this flow are performed by the functions of control apparatus 30, it is assumed here that the steps in this flow are performed by the CPU.

First, in step S100, the CPU determines whether or not negative electrode side relay 12 is welded. In a case where negative electrode side relay 12 is welded (step S100: YES), the processing proceeds to step S110. In a case where negative electrode side relay 12 is not welded (step S100: NO), the processing proceeds to step S130.

In step S110, the CPU executes control of performing passive discharge.

Next, in step S120, the CPU determines whether or not the positive electrode side relay is welded. Then, this flow is finished.

In step S130, the CPU executes control of performing active discharge. Then, the processing proceeds to step S120.

A relay welding diagnosing apparatus according to the embodiment of the present disclosure in power source system 1 including positive electrode side relay 11 whose one terminal is connected to a positive electrode side of battery 10, negative electrode side relay 12 whose one terminal is connected to a negative electrode side of battery 10, and capacitor 15 and load circuit 20 that are connected in parallel between the other terminal of positive electrode side relay 11 and the other terminal of negative electrode side relay 12 includes a control section that executes control for performing active discharge of capacitor 15, which is forced discharge, by connecting capacitor 15 and load circuit 20 and determining section 32 that, in a case where negative electrode side relay 12 is not welded, determines whether or not positive electrode side relay 11 is welded after active discharge is performed and, in a case where negative electrode side relay 12 is welded, determines whether or not positive electrode side relay 11 is welded after passive discharge of capacitor 15, which is natural discharge, is performed.

According to the configuration, since active discharge is performed in a case where negative electrode side relay 12 is not welded at a time of relay welding diagnosis, it is possible to prevent energy of battery 10 from being discharged uselessly. Furthermore, since a period required for welding diagnosis in a case where welding diagnosis is performed by active discharge is shorter than a period required for welding diagnosis in a case where welding diagnosis is performed by passive discharge, a risk of erroneous diagnosis can be lowered.

Determining section 32 determines whether or not positive electrode side relay 11 is welded after determining whether or not negative electrode side relay 12 is welded. Diagnosis of welding of negative electrode side relay 12 can be performed preferentially over welding diagnosis of positive electrode side relay 11.

In the embodiment, control apparatus 30 executes control of performing forced discharge (active discharge) of capacitor 15 by connecting capacitor 15 and load circuit 20, and a known means or method that can discharge an electric charge stored in capacitor 15 and pass an electric current through load circuit 20 is used as a means or method for connecting capacitor 15 and load circuit 20.

The above embodiment merely illustrates a specific example of the present disclosure, and the technical scope of the present disclosure should not be interpreted in a restrictive manner by the above embodiment. That is, the present disclosure can be modified in various ways without departing from the spirit and main features of the present disclosure.

The present application is based on Japanese Patent Application No. 2022-048956 filed on Mar. 24, 2022, the contents of which are hereby incorporated by reference.

INDUSTRIAL APPLICABILITY

The present disclosure is suitably applied to a vehicle in which a relay welding diagnosing apparatus that is required to lower a risk of erroneous diagnosis while preventing energy of a battery from being discharged uselessly is mounted.

REFERENCE SIGNS LIST

S1,S2,S3 voltage measuring section
1 power source system
10 battery
11 positive electrode side relay
12 negative electrode side relay
13,14 resistor
15 capacitor
20 load circuit
30 control apparatus
31 relay control section
32 determining section
33 storage section

The invention claimed is:

1. A relay welding diagnosing apparatus in a power source system including a positive electrode side relay whose one terminal is connected to a positive electrode side of a battery, a negative electrode side relay whose one terminal is connected to a negative electrode side of the battery, and a capacitor and a load circuit that are connected in parallel between another terminal of the positive electrode side relay and another terminal of the negative electrode side relay, the relay welding diagnosing apparatus comprising:
   a control section that executes control for performing active discharge of the capacitor, which is forced discharge, by connecting the capacitor and the load circuit; and
   a determining section that, in a case where the negative electrode side relay is not welded, determines whether or not the positive electrode side relay is welded after the active discharge is performed and, in a case where the negative electrode side relay is welded, determines whether or not the positive electrode side relay is welded after passive discharge of the capacitor without connecting the capacitor and the load circuit, which is natural discharge, is performed.

2. The relay welding diagnosing apparatus according to claim 1, wherein the determining section determines whether or not the positive electrode side relay is welded after determining whether or not the negative electrode side relay is welded.

* * * * *